United States Patent
Itaya

(10) Patent No.: US 10,627,432 B2
(45) Date of Patent: Apr. 21, 2020

(54) POWER-GENERATION-AMOUNT ESTIMATION APPARATUS AND POWER-GENERATION-AMOUNT ESTIMATION METHOD

(71) Applicant: MITSUBISHI ELECTRIC CORPORATION, Chiyoda-ku, Tokyo (JP)

(72) Inventor: Nobuhiko Itaya, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 505 days.

(21) Appl. No.: 15/315,033

(22) PCT Filed: Jun. 13, 2014

(86) PCT No.: PCT/JP2014/065767
§ 371 (c)(1),
(2) Date: Nov. 30, 2016

(87) PCT Pub. No.: WO2015/189991
PCT Pub. Date: Dec. 17, 2015

(65) Prior Publication Data
US 2017/0199233 A1    Jul. 13, 2017

(51) Int. Cl.
*G01R 21/133*    (2006.01)
*H02S 50/00*    (2014.01)
(Continued)

(52) U.S. Cl.
CPC .......... *G01R 21/133* (2013.01); *G01R 27/26* (2013.01); *H02J 3/383* (2013.01); *H02S 50/00* (2013.01); *Y02E 10/563* (2013.01)

(58) Field of Classification Search
CPC ... Y04S 10/12; Y10T 307/492; G01R 21/133; G01R 27/26; H02J 3/383; H02S 50/00; Y02E 10/563
See application file for complete search history.

(56) References Cited

U.S. PATENT DOCUMENTS 5,760,492 A      6/1998  Kanoi et al.
2012/0280673 A1* 11/2012  Watanabe .............. H02J 3/1885
                                            323/304

FOREIGN PATENT DOCUMENTS

JP    9-154235 A    6/1997
JP    11-289663 A   10/1999
(Continued)

OTHER PUBLICATIONS

International Search Report (PCT/ISA/210) dated Jul. 15, 2014, by the Japanese Patent Office as the International Searching Authority for International Application No. PCT/JP2014/065767.
(Continued)

*Primary Examiner* — Kyle R Quigley
(74) *Attorney, Agent, or Firm* — Buchanan Ingersoll & Rooney PC

(57) ABSTRACT

A power-generation-amount estimation apparatus estimating photovoltaic power generation amount carried along a power distribution line in a high-voltage system to which loads and photovoltaic power generation equipments are connected, includes: a communication unit receiving voltage and active power at the end point on the upstream side of a power distribution line and voltage and active power at the end point on the downstream side; a load/power-generation center calculator calculating impedance at a load center point based on contract information and the connection position of each load and calculating impedance at a power generation center point based on the connection position and the power generation capacity of each photovoltaic power
(Continued)

generation equipment; and a load/power-generation-amount calculator estimating the photovoltaic power generation amount based on the impedance at the load center point, the impedance at the power generation center point, and the voltages and active powers received by the communication unit.

14 Claims, 5 Drawing Sheets

(51) Int. Cl.
*G01R 27/26* (2006.01)
*H02J 3/38* (2006.01)

(56) References Cited

FOREIGN PATENT DOCUMENTS

| | | |
|---|---|---|
| JP | 11-289664 A | 10/1999 |
| JP | 2006-93176 A | 4/2006 |
| JP | 2008-236897 A | 10/2008 |
| JP | 2010-213513 A | 9/2010 |
| JP | 2011-187743 A | 9/2011 |
| JP | 2012-170236 A | 9/2012 |

OTHER PUBLICATIONS

Written Opinion (PCT/ISA/237) dated Jul. 1, 2014, by the Japanese Patent Office as the International Searching Authority for International Application No. PCT/JP2014/065767.

\* cited by examiner

| NUMBER | CONTRACTED POWER | TYPE OF CONTRACT | TYPE OF INDUSTRY |
|---|---|---|---|
| 1 | $A_1$ | $B_1$ | $C_1$ |
| 2 | $A_2$ | $B_2$ | $C_2$ |
| 3 | ⋮ | ⋮ | ⋮ |
| ⋮ | | | |

POWER-GENERATION-AMOUNT ESTIMATION APPARATUS AND POWER-GENERATION-AMOUNT ESTIMATION METHOD

FIELD

The present invention relates to a power-generation-amount estimation apparatus and a power-generation-amount estimation method.

BACKGROUND

A power distribution system is generally made up of a high-voltage system (normally 6600 V) and a low-voltage system (for example, 100 V to 200 V). Power-receiving terminations used by general consumers are connected to the low-voltage system. Power utilities are obligated to maintain the voltage at the power-receiving terminations used by general consumers within an appropriate range (for example, between 95 V and 107 V in the case of a receiving power of 100 V). Therefore, power utilities adjust the amount of control (for example, operate a tap) of a voltage control apparatus (such as an LRT (Load Ratio Control Transformer: on-load tap-changer transformer) or an SVR (Step Voltage Regulator)) connected to the high-voltage system in order to maintain the voltage at the power-receiving terminations used by general consumers. In the following descriptions, a power distribution system indicates a high-voltage system thereof unless otherwise specified.

Photovoltaic systems of various sizes, such as residential photovoltaic systems and mega solar systems, have recently been connected to power distribution systems and thus it is becoming essential when operating the systems to know the amount of photovoltaic power generation carried along each power distribution line (or each power distribution section). It is possible to estimate the amount of photovoltaic power generation carried along each power distribution line on the basis of the amount of photovoltaic power generation measured at a plurality of points in the power distribution line or the amount of solar radiation measured for each power distribution line. These methods, however, necessitate installation and management of measurement equipment and communication equipment. Moreover, it is considered imperative to know approximate voltages of the power distribution lines in order to maintain the power distribution system at an appropriate voltage. Thus, there is a plan to dispose sensors near the delivery points and the terminations of the power distribution lines and measure the voltage, current, active power, inactive power, and the like.

A method is disclosed in Patent Literature 1 below of measuring the active power and inactive power upstream of a photovoltaic device and estimating the photovoltaic power generation output by using independent component analysis.

CITATION LIST

Patent Literature

Patent Literature 1: Japanese Patent Application Laid-open No. 2012-170236

SUMMARY

Technical Problem

However, the above method of measuring the amount of solar radiation or the like and estimating the amount of photovoltaic power generation carried along each power distribution line has a problem in that measurement equipment and communication equipment need to be installed and managed. The estimation method disclosed in Patent Literature 1 described above estimates the photovoltaic power generation output in accordance with an approximate curve determined on the basis of the result of the independent component analysis performed using previously measured values, which poses a problem in that the estimation error may increase.

The present invention has been achieved in view of the above and an object of the present invention is to provide a power-generation-amount estimation apparatus and a power-generation-amount estimation method that can accurately estimate the amount of photovoltaic power generation while preventing an increase in the number of measurement equipments and communication equipments.

Solution to Problem

In order to solve the above problems and achieve the object, an aspect of the present invention is a power-generation-amount estimation apparatus that estimates an amount of photovoltaic power generation carried along a power distribution line in a high-voltage system to which a plurality of loads and at least one photovoltaic power generation equipment are connected, the power-generation-amount estimation apparatus including: a communication unit to receive a first voltage value, which is a measured voltage at a first position on the power distribution line, a first active power, which is a measured value of an active power at the first position, a second voltage value, which is a measured voltage at a second position on the power distribution line, and a second active power, which is a measured value of an active power at the second position; a storage to store contract information and a connection position of each of the loads, the first voltage value, the second voltage value, the first active power, and the second active power; a load center calculator to calculate an impedance at a load center point on a basis of the contract information and the connection position of each of the loads that are read from the storage; a power generation center calculator to calculate an impedance at a power generation center point on a basis of a connection position and a power generation capacity of each photovoltaic power generation equipment; and a power generation amount calculator to estimate the amount of photovoltaic power generation on a basis of the impedance at the load center point, the impedance at the power generation center point, the first voltage value, the second voltage value, the first active power, and the second active power.

Advantageous Effects of Invention

According to the present invention, an effect is obtained where the amount of photovoltaic power generation can be accurately estimated while preventing an increase in the number of measurement equipments and communication equipments.

DESCRIPTION OF EMBODIMENTS

Exemplary embodiments of a power-generation-amount estimation apparatus and a power-generation-amount estimation method according to the present invention will be explained below in detail with reference to the drawings. This invention is not limited to the embodiments.

Embodiment

Figure 1:
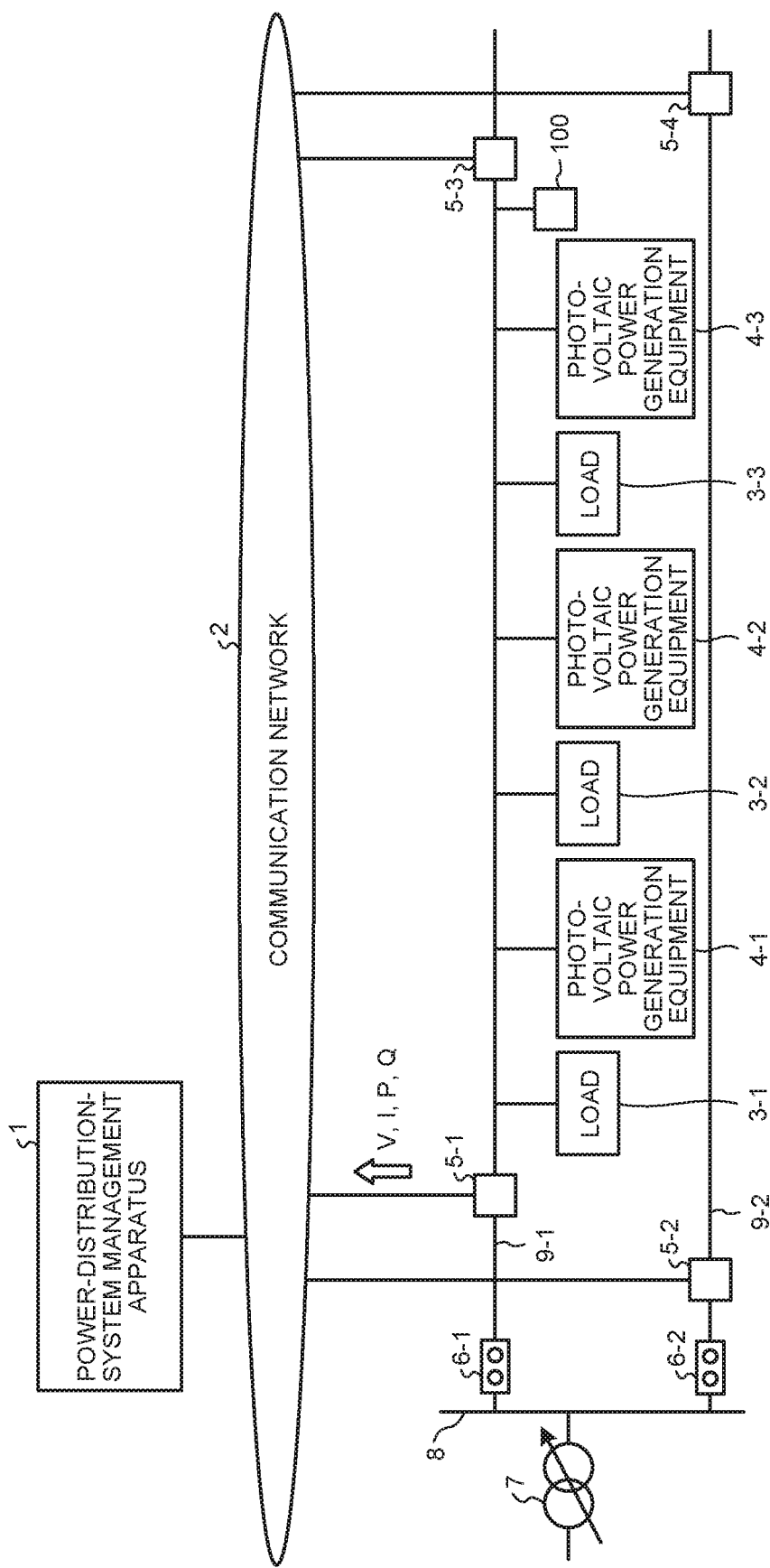
FIG. 1 is a diagram illustrating an example configuration of a voltage control system in a power distribution system according to an embodiment of the present invention.

FIG. 1 is a diagram illustrating an example configuration of a voltage control system in a power distribution system according to an embodiment of the present invention. In FIG. 1, a voltage control apparatus 7 is, for example, an LRT (Load Ratio Control Transformer: on-load tap changer transformer) that functions as a power-distribution transformer provided at a substation. On the secondary side of the voltage control apparatus 7, a bus-bar 8 is connected. For example, two power distribution lines 9-1 and 9-2, which are in parallel, are connected to the bus-bar 8. The power distribution lines 9-1 and 9-2 are high-voltage system (with a voltage level of 6600 V) power distribution lines.

The power distribution line 9-1 is connected at its one end to the bus-bar 8 via a breaker 6-1. On the power distribution line 9-1, voltage and power-flow measurement devices (measurement devices) 5-1 and 5-3 are provided, each of which measures the voltage and the power flow on the power distribution line 9-1. The power distribution line 9-2 is connected at its one end to the bus-bar 8 via a breaker 6-2. On the power distribution line 9-2, voltage and power-flow measurement devices (measurement devices) 5-2 and 5-4 are provided, each of which measures the voltage and the power flow on the power distribution line 9-2. The voltage and power-flow measurement devices 5-1 and 5-2 are disposed at the delivery points (end points on the upstream side) of the power distribution lines 9-1 and 9-2, respectively. The voltage and power-flow measurement devices 5-3 and 5-4 are disposed at the terminations (end points on the downstream side) of the power distribution lines 9-1 and 9-2, respectively. The voltage and power-flow measurement devices 5-1 to 5-4 each measure the voltage, power flow, and the like, for example, at regular time intervals (for example, every second) and transmit the average value of the measurements over a predetermined period of time (for example, one minute) as measurement information. The voltage and power-flow measurement devices 5-1 to 5-4 each have a communication function and are connected to a communication network 2. The voltage and power-flow measurement devices 5-1 to 5-4, for example, regularly transmit the measurement information to a power-distribution-system management apparatus 1 via the communication network 2.

Loads 3-1 to 3-3, photovoltaic power generation equipments 4-1 to 4-3, and a capacitor 100 are connected to the power distribution line 9-1. The load 3-1, for example, represents the load due to each customer. Alternatively, the load 3-1 may be, for example, the load due to a pole transformer, i.e., the load due to a group of one or more customers. The number of loads, photovoltaic power generation equipments, and capacitors connected to the power distribution line 9-1 is not limited to the number illustrated as an example in FIG. 1. The capacitor 100 is also a load on the power distribution line 9-1. A capacitor may be included in the loads 3-1 to 3-3. In FIG. 1, loads, photovoltaic power generation equipments, and capacitors connected to the power distribution line 9-2 are omitted for simplifying the drawings even though loads, photovoltaic power generation equipments, and capacitors are also connected to the power distribution line 9-2.

The power-distribution-system management apparatus 1 (power-generation-amount estimation apparatus) is an apparatus that manages the power distribution system and can be provided in a service office, a control station, or the like, that manages the management objective region of the system.

The voltage control system in the power distribution system according to the present embodiment controls the voltage such that the power distribution system maintains an appropriate voltage. The voltage can be controlled by any method. For example, a centralized control device connected to the communication network 2 can control the voltage. The voltage and power-flow measurement devices 5-1 to 5-4 are installed in order to perform the voltage control described above. The active power (P) and the voltage (V) measured by the voltage and power-flow measurement devices 5-1 to 5-4 are used for the voltage control described above.

Figure 2:
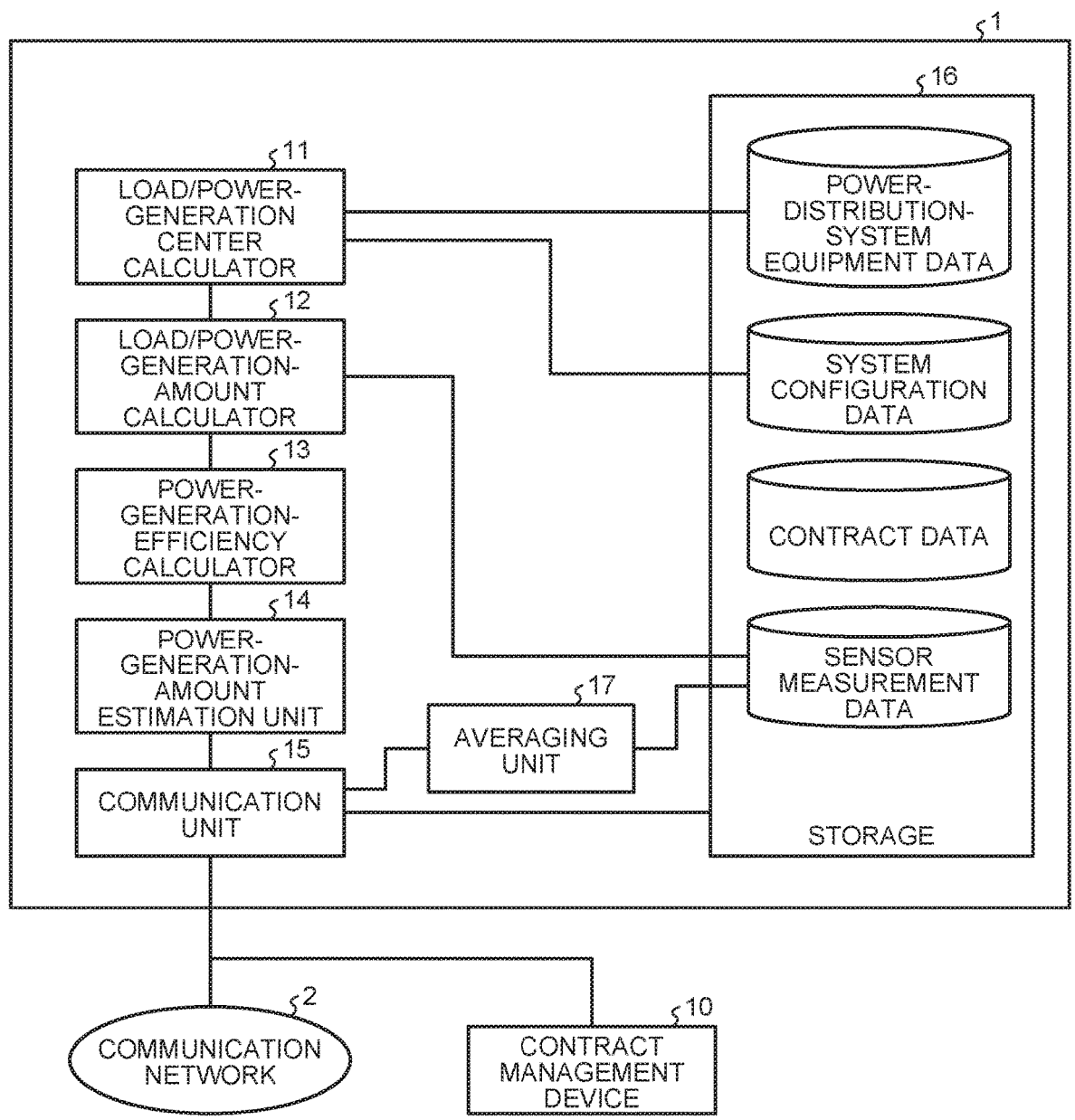
FIG. 2 is a diagram illustrating an example configuration of a power-distribution-system management apparatus.

In the present embodiment, as described above, the amount of photovoltaic power generation carried along each power distribution line is estimated by using the data measured by the voltage and power-flow measurement devices 5-1 to 5-4 that are installed to perform the voltage control. FIG. 2 is a diagram illustrating an example configuration of the power-distribution-system management apparatus 1 according to the present embodiment. As illustrated in FIG. 2, the power-distribution-system management apparatus 1 in the present embodiment includes a load/power-generation center calculator 11, a load/power-generation-amount calculator 12, a power-generation-efficiency calculator 13, a power-generation-amount estimation unit 14, a communication unit 15, a storage 16, and an averaging unit 17.

Figure 3:
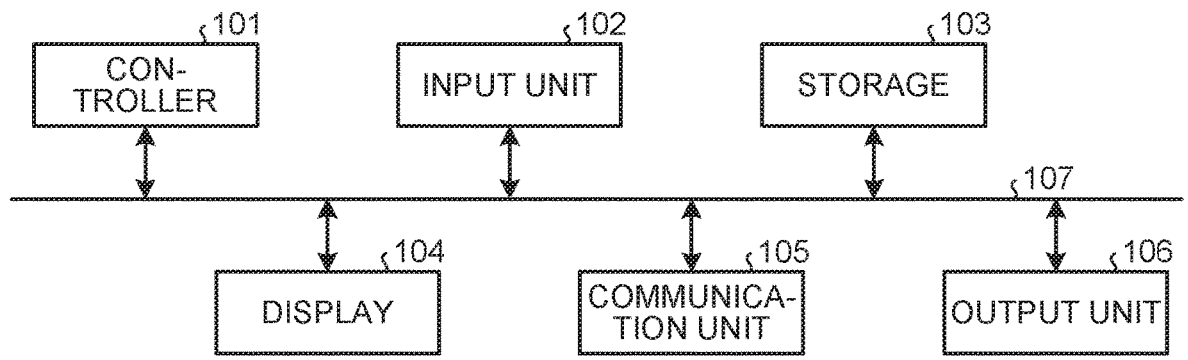
FIG. 3 is a diagram illustrating an example configuration of a computer system according to the embodiment.

The power-distribution-system management apparatus 1 is specifically a computer system (computer). The computer system functions as the power-distribution-system management apparatus 1 by itself executing a demand-and-supply schedule program. FIG. 3 is a diagram illustrating an example configuration of the computer system according to the present embodiment. As illustrated in FIG. 3, the computer system includes a controller 101, an input unit 102, a storage 103, a display 104, a communication unit 105, and an output unit 106. These units are connected to each other via a system bus 107.

In FIG. 3, the controller 101 is, for example, a CPU (Central Processing Unit) and executes the demand-and-supply schedule program in the present embodiment. The input unit 102 includes, for example, a keyboard and a mouse. The user of the computer system uses the input unit 102 to input various pieces of information. The storage 103 includes various types of memories, such as a RAM (Random Access Memory) and a ROM (Read Only Memory), and a storage device, such as a hard disk. The storage 103 stores therein programs to be executed by the controller 101, necessary data acquired during processes, and the like. The storage 103 is used also as a temporary storage area for programs. The display 104 is composed of, for example, an LCD (liquid crystal display panel) and displays various screens for the user of the computer system. The communication unit 105 has a function to connect to the communication network 2, and the communication unit 105 receives measurement data from the voltage and power-flow measurement devices 5-1 to 5-4 via the communication network 2. FIG. 3 is an example and the configuration of the computer system is not limited to the example in FIG. 3.

An explanation will be given here of an example of an operation of the computer system before the power-generation-amount estimation program in the present embodiment becomes executable. In the computer system configured as above, the power-generation-amount estimation program is installed in the storage 103, for example, from a CD (Compact Disc)-ROM or a DVD (Digital Versatile Disc)-ROM set in a CD-ROM drive or a DVD-ROM drive (not illustrated). Then, when the power-generation-amount estimation program is executed, the power-generation-amount estimation program read from the storage 103 is stored at a predetermined location in the storage 103. In such a state, the controller 101 executes the power-generation-amount estimation process in the present embodiment according to the program stored in the storage 103.

In the present embodiment, a CD-ROM or a DVD-ROM as a recording medium is used to provide a program (power-generation-amount estimation program) that describes the power-generation-amount estimation process; however, it is not limited thereto and it is also possible to use, for example, a program provided by a transmission medium, such as the Internet, via the communication unit 105 in accordance with the configuration of the computer system, the capacity of the program to be provided, and the like.

The controller 101 in FIG. 3 includes the load/power-generation center calculator 11, the load/power-generation-amount calculator (power-generation-amount calculator) 12, the power-generation-efficiency calculator 13, and the power-generation-amount estimation unit 14 in FIG. 2. The storage 16 in FIG. 2 is part of the storage 103 in FIG. 3. The communication unit 15 in FIG. 2 corresponds to the communication unit 105 in FIG. 3. In the present embodiment, the load/power-generation center calculator 11 is configured such that it has a function as a load-center-point calculator that calculates the load center point and a function as a power-generation-center-point calculator that calculates the power generation center point; however, the load-center-point calculator and the power-generation-center-point calculator may be separate units.

A power-generation-amount estimation method according to the present embodiment will be explained next. An explanation will be given of an example of estimating the total amount of photovoltaic power generation carried along the power distribution line 9-1; however, the total amount of photovoltaic power generation carried along the power distribution line 9-2 can also be estimated in a similar manner. The storage 16 of the power-distribution-system management apparatus 1 stores therein power-distribution-system equipment data, system configuration data, contract data, and sensor measurement data.

The power-distribution-system equipment data includes information, such as load utilization characteristics; the connection positions of the loads 3-1 to 3-3, the capacitor 100, and the photovoltaic power generation equipments 4-1 to 4-3; the capacities of the panels (solar panels) of the photovoltaic power generation equipments 4-1 to 4-3; power-distribution-line resistance information; and power-distribution-line reactance information. The system configuration data, for example, includes information indicative of whether the breakers 6-1 and 6-2 are open or closed. The power-distribution-system equipment data and the system configuration data are stored in advance in the storage 16. When equipment or the like is changed, an operator or the like inputs new information from the input unit 102 of the computer system, thereby updating the data in the storage 16.

The contract data includes information on the contracted power, the type of contract, the type of industry, and the like of each customer or group of one or more customers (for example, each pole transformer). The contract data may be stored in advance in the storage 16 together with the power-distribution-system equipment data and the system configuration data. Alternatively, as illustrated in FIG. 2, the power-distribution-system management apparatus 1 may acquire the contract data from a contract management device 10 that manages the contract details and store the contract data in the storage 16.

The sensor measurement data is measurement data received from the voltage and power-flow measurement devices 5-1 to 5-4 via the communication network 2 or the average values of the measurement data received over a fixed period of time (for example, 30 minutes). In order to store the averaged results, the averaging unit 17 calculates the average value of the measurement data received from the communication unit 15 over a fixed period of time for each of the measurement points (the voltage and power-flow measurement devices 5-1 to 5-4) and stores them as the measurement data in the storage 16. In the present embodiment, the active power and voltage are used to estimate the amount of power generation. Thus, measurement data other than above-described measurement data need not be stored in the storage 16.

Figure 4:
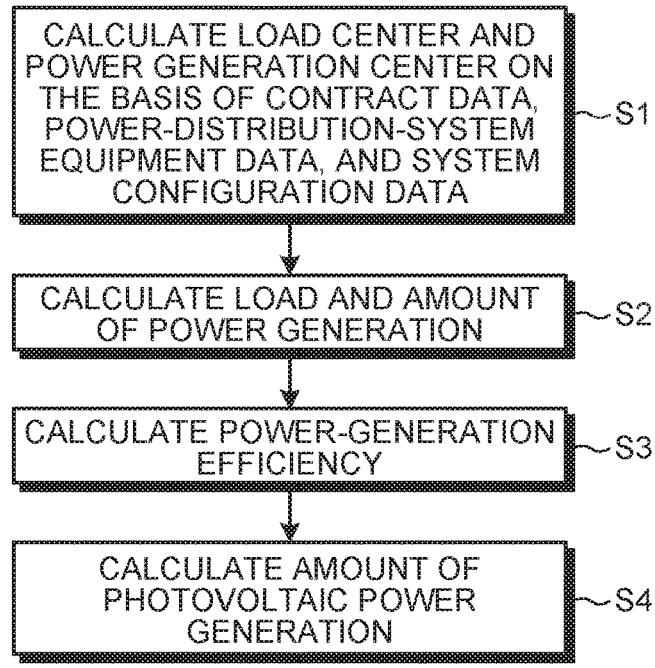
FIG. 4 is a flowchart illustrating an example of a power-generation-amount estimation procedure.
Figure 5:
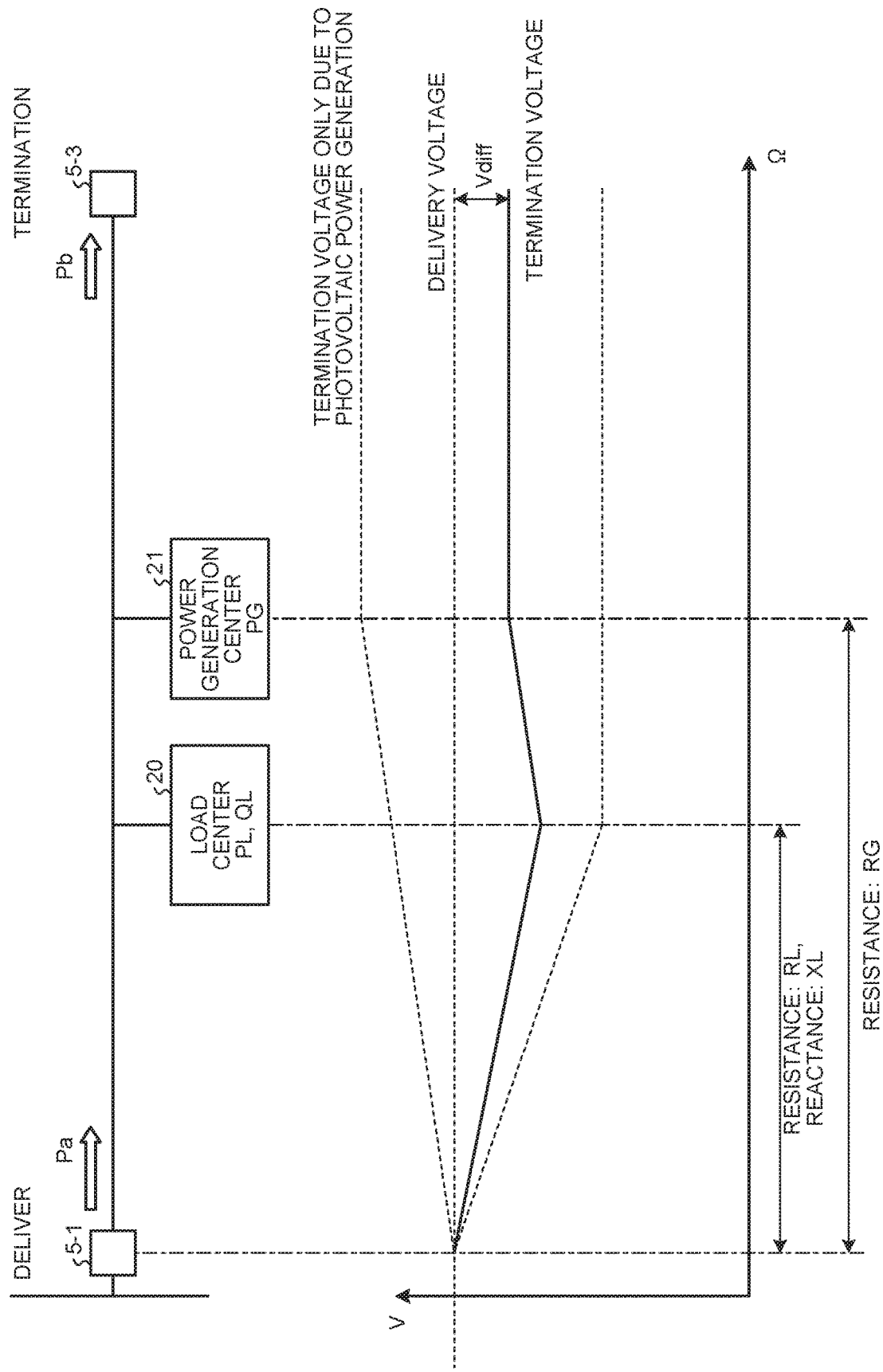
FIG. 5 is a conceptual diagram illustrating the relation between a load center point, a power generation center point, a delivery voltage, and a termination voltage.

FIG. 4 is a flowchart illustrating an example of the power-generation-amount estimation procedure according to the present embodiment. The power-distribution-system management apparatus 1 may perform a power-generation-amount estimation according to the procedure illustrated in FIG. 4 at regular time intervals (for example, every 30 minutes) or may perform the power-generation-amount estimation when it is necessary to know the amount of power generation during operations such as maintenance. In other words, the power-distribution-system management apparatus 1 can perform the power-generation-amount estimation at any given point in time. The loads are connected at various locations on the power distribution line 9-1 in a distributed manner, and the power factors of these loads can be regarded as substantially the same. Therefore, the voltage drop due to the loads can be calculated by using a model in which all the loads are concentrated at a load center point (the center of concentration of the loads on the power distribution line). In a similar manner, the voltage rise due to the photovoltaic power generation can be calculated by using a model in which all the photovoltaic power generations are concentrated at a power generation center point (the center of concentration of the photovoltaic power generations on the power distribution line). FIG. 5 is a conceptual diagram illustrating the relation between a load center 20, a power generation center 21, a delivery voltage, and a termination voltage.

First, the load/power-generation center calculator 11 calculates the load center point and the power generation center point on the basis of the power-distribution-system equipment data, the system configuration data, and the contract data (Step S1). Specifically, the load/power-generation center calculator 11 calculates the load center point on the basis of the connection positions (the resistance (impedance) or distance from the measurement point of the voltage and power-flow measurement device 5-1 to the loads 3-1 to 3-3) of the loads (the loads 3-1 to 3-3 and the capacitor 100) connected to the power distribution line 9-1, the contracted capacity of each load connected to the power distribution line 9-1, and the load utilization characteristics.

It is assumed that the measured voltage at the measurement point (first position) of the voltage and power-flow measurement device 5-1 on the power distribution line 9-1 is a delivery voltage Va and the measured voltage at the measurement point (second position) of the voltage and power-flow measurement device 5-3 is a termination voltage Vb. Moreover, it is assumed that the measured value of the active power at the measurement point of the voltage and power-flow measurement device 5-1 is indicated by Pa and the measured value of the active power at the measurement point of the voltage and power-flow measurement device 5-3 is indicated by Pb. The distance Lc from the measurement point (installation position of the voltage and power-flow measurement device 5-1) of the delivery voltage Va to the load center point can be calculated by the following equation (1):

$$Lc=\Sigma(PI_i \times I_i)/\Sigma(PI_i) \qquad (1)$$

where N represents the total number of loads connected to the power distribution line 9-1, $PI_i$ represents the contracted power of the i-th load among the loads connected to the power distribution line 9-1, $I_i$ represents the impedance, and $\Sigma$ represents the sum of i=1 to i=N.

The impedance Ii is calculated on the basis of the power-distribution-line resistance information, the power-distribution-line reactance information, and the connection position of each load that are stored as the power-distribution-system equipment data. When the resistance value is approximated as being proportional to the length of the power distribution line, the power-distribution-line resistance information is a proportional constant to calculate the resistance value in accordance with the length of the power distribution line. When the reactance value is approximated as being proportional to the length of the power distribution line, the power-distribution-line reactance information is a proportional constant to calculate the reactance in accordance with the length of the power distribution line. The resistance and the reactance of each load may be stored instead of storing the power-distribution-line resistance information, the power-distribution-line reactance information, and the connection positions.

The load center point is a point at which the distance from the measurement point of the delivery voltage Va is Lc. The resistance RL and the reactance XL at the load center point can be calculated on the basis of the power-distribution-line resistance information, the power-distribution-line reactance information, and Lc.

With regard to the power generation center point in the power distribution line 9-1, the distance Lg from the measurement point of the delivery voltage Va to the power generation center point can be calculated by the following equation (2):

$$Lg=\Sigma(Ps_i \times R_i)/\Sigma(Ps_i) \qquad (2)$$

where Ri represents the resistance of the i-th equipment among the photovoltaic power generation equipments 4-1 to 4-3, $Ps_i$ represents the panel capacity, M represents the number of the photovoltaic power generation equipments 4-1 to 4-3 in the power distribution line 9-1, and $\Sigma$ represents the sum of i=1 to i=M.

Ri is calculated on the basis of the power-distribution-line resistance information, the power-distribution-line reactance information, and the connection position of each of the photovoltaic power generation equipments 4-1 to 4-3 that are stored as the power-distribution-system equipment data. The power generation center point is a point at which the distance from the measurement point of the delivery voltage Va is Lg. The resistance RG at the power generation center point can be calculated on the basis of the power-distribution-line resistance information and Lg.

Next, the load and the amount of power generation are calculated on the basis of the load center point, the power generation center point, the delivery voltage, and the termination voltage (Step S2). Specifically, the simultaneous equations consisting of three equations established for the following three items are solved, thereby acquiring the load power PL and the amount of power generation PG carried along a single power distribution line 9-1.

(a) The voltage difference Vdiff between the measured values of the delivery voltage and the termination voltage of the power distribution line $$V\text{diff}=Vb-Va-Vqc \qquad (3)$$

Vdiff is defined such that it takes a positive value when the termination voltage is higher. Vqc represents the amount of voltage rise across the capacitor on the power distribution line 9-1.

(b) Voltage drop due to the load and voltage rise due to power generation $$\begin{aligned} V\mathit{diff} &= PG \times RG - (PL \times RL + QL \times XL) \\ &= PG \times RG - PL \times (RL + \alpha \times XL) \end{aligned} \qquad (4)$$

where α is equal to QL/PL and the numerical value thereof is predetermined (for example, α=0.1).

(c) Sum of the load power and the amount of power generation and measured active power $$Pb-Pa=PG-PL \qquad (5)$$

The following equation (6) is derived from equations (3) to (5) described above.

$$V\text{diff}=PG \times RG-(PG+Pa-Pb) \times (RL+\alpha \times XL) \qquad (6)$$

PG can be calculated as follows by using equation (6).

$$PG=(V\text{diff}-(Pb-Pa) \times (RL+\alpha \times XL))/(RG-RL-\alpha \times XL) \qquad (7)$$

Vqc is acquired in advance on the basis of, for example, the measurement data taken during the night when solar power is not generated. Because the number of connected capacitors does not change between the day time and the night time, the voltage rise across the capacitor is constant. When there is no capacitor on the power distribution line 9-1, Vqc in the above equation (3) does not have to be taken into consideration.

It is assumed for the above equations that the average power factor of the photovoltaic power generation is 100%; however, when the average power factor is not 100%, in a similar manner to XL at the load center point, the reactance XG at the power generation center point is also calculated, and the reactance and the inactive power are taken into consideration in a similar manner to the load center point.

With regard to Va, Vb, Pa, and Pb, as described above, the average values over a fixed period of time may be stored or the measurement data may be stored as it is. When the measurement data is stored as it is, the average values over a fixed period of time are calculated on the basis of the stored measurement data before the calculation at Step S2 and thus these average values can be used as Va, Vb, Pa, and Pb.

Next, the power-generation-efficiency calculator 13 takes the ratio between the amount of power generation and the sum of panel capacities to calculate the power generation efficiency (Step S3). When the power generation efficiency is not within the range of 0% to 100%, the power-generation-efficiency calculator 13 corrects the power generation efficiency such that it falls within the range of 0% to 100%. In the present embodiment, it is assumed that power generation other than photovoltaic power generation is included in the load.

The power-distribution-system management apparatus 1 performs Step S1 to Step S3 described above on the power distribution lines on which the voltage/power-flow measurement devices are installed among all the power distribution lines (for example, all the power distribution lines under the control of the same substation) managed by itself to calculate the amount of power generation and the power generation efficiency of each power distribution line in a similar manner.

The power-generation-amount estimation unit 14 calculates the average power generation efficiency by weight-averaging the panel capacities by using the power generation efficiency of each power distribution line. The power-generation-amount estimation unit 14 then estimates the amount of power generation carried along the power distribution lines on which the voltage/power-flow measurement devices are not installed (Step S4). Specifically, the power-generation-amount estimation unit 14 calculates the estimated value of the amount of power generation by multiplying the average power generation efficiency by the panel capacities of the photovoltaic power generation equipment on the power distribution lines on which the voltage/power-flow measurement devices are not installed.

When there is no power distribution line on which the voltage/power-flow measurement devices are installed among all the power distribution lines managed by the power-distribution-system management apparatus 1, it is possible for the power-distribution-system management apparatus 1 to not perform Steps S3 and S4. In the present embodiment, as described above, the amount of photovoltaic power generation can be estimated by using the equipment data and the measurement data acquired by the voltage/power-flow measurement devices installed on the power distribution line; therefore, it is not necessary to install and manage additional measurement and communication equipment, such as a pyranometer. This reduces the expenditure on equipment.

In the present embodiment, the amount of photovoltaic power generation is estimated for each power distribution line; however, it is not limited thereto. The amount of photovoltaic power generation between two given measurement points can be estimated in a similar manner by using the measurement data on the two measurement points in the power distribution line on which the voltage/power-flow measurement devices are installed. For example, when the voltage/power-flow measurement devices are installed in each power distribution section, the amount of photovoltaic power generation can be estimated for each power distribution section.

Figures 6, 7:
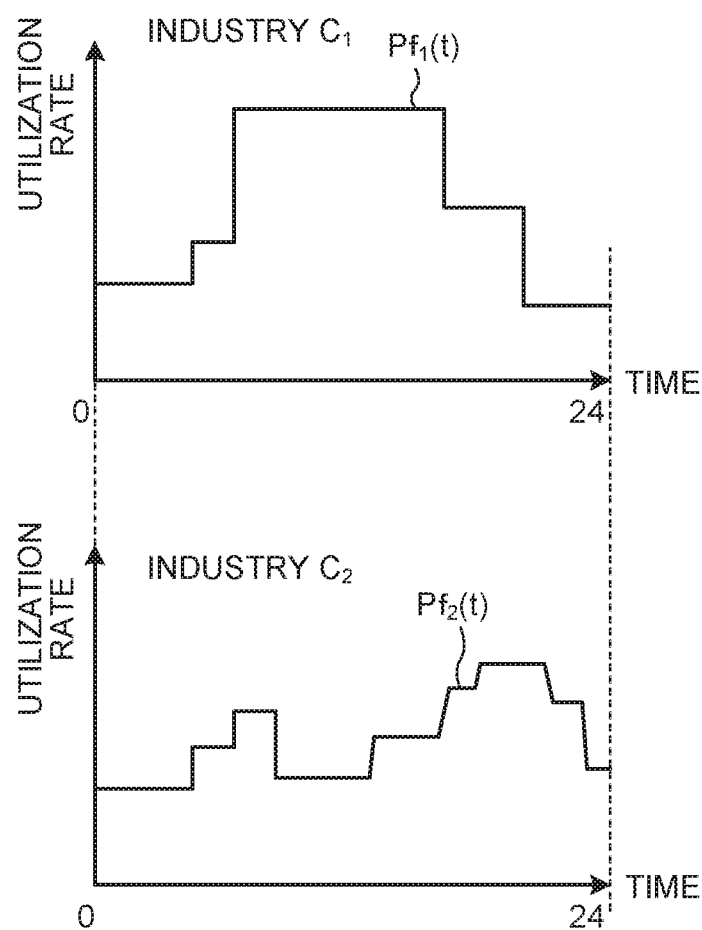
FIG. 6 is a diagram illustrating an example of contract information.
FIG. 7 is a conceptual diagram illustrating an average value of a profile of the power consumption for each type of contract.

In the above example, as represented by the above equation (1), the load center point is calculated by using the contracted power of each load; however, as will be described below, it is also possible to calculate the load center point by using more detailed contract information. For example, it is possible to take, as the contract information, the type of contract, the type of industry, and the like into consideration in addition to the contracted power. The contract information illustrated in FIG. 6 is then stored for each load as contract data. FIG. 6 is a diagram illustrating an example of the contract information. Examples of the type of contract include a normal contract, a late-night power contract, and a contract in which the charge changes depending on the time. The consumption power has a certain behavior that depends on the type of contract for each time slot during the day. FIG. 7 is a conceptual diagram illustrating the average value of the profile of the power consumption for each type of contract.

When the value of each customer is used as the contract information, the contract information on each customer can be directly used; however, when a single pole transformer is regarded as one load, for example, the average value of the contract information on customers connected to the pole transformer is used.

For example, the average value of the profile of the power consumption is calculated in advance as a function $Pf_j(t)$ of time t for each type of contract. j represents the number for identifying the type of contract. The average value is calculated in advance as the utilization rate by performing normalization using the contracted power. Then, instead of using equation (1), the load center point is calculated by using equation (8):

$$Lc = \Sigma(A_i \times Pf_{j(i)}(t) \times l_i) / \Sigma(A_i \times Pf_{j(i)}(t)) \qquad (8)$$

where $A_i$ represents the contracted power of the i-th load and j(i) represents the number of the type of contract of the i-th load.

$Pf_j(t)$ may be acquired in advance as a function of time t. Alternatively, values acquired at regular time intervals (for example, every hour) may be stored as a table and the value of $Pf_j(t)$ may be acquired by referring to the table. Moreover, in a similar manner, seasonal changes may be taken into consideration in $Pf_j(t)$. For example, when M represents a month (any of January to December) and S(M) represents a season correction coefficient for each month, then $A_i \times Pf_{j(i)}(t)$ in each of the denominator and numerator may be multiplied by S(M).

In a similar manner, the average value of the profile of the power consumption may be calculated in advance as a function $Ph_j(t)$ of time t for each type of industry and the load center point may be calculated by using the following equation (9). In equation (9), j(i) represents the number of the type of industry of the i-th load. The type of industry that can be considered includes factory, residence, commerce, and the like. In a similar manner to the type of contract, $A_i \times Ph_{j(i)}(t)$ in equation (9) may be multiplied by a season correction coefficient.

$$Lc = \Sigma(A_i \times Ph_{j(i)}(t) \times l_i) / \Sigma(A_i \times Ph_{j(i)}(t)) \qquad (9)$$

Both the type of contract and the type of industry may be taken into consideration. For example, $Pf_{j(i)}(t) \times Ph_{j(i)}(t)$ may be used instead of $Pf_{j(i)}(t)$ in equation (8). Furthermore, in such a case, $A_i \times Pf_{j(i)}(t) \times Ph_{j(i)}(t)$ may be multiplied by a season correction coefficient.

As described above, in the present embodiment, the load center point and the power generation center point are calculated by using the equipment data, and the amount of photovoltaic power generation is estimated on the basis of the measurement data of two voltage and power-flow measurement devices disposed on the power distribution line, the load center point, and the power generation center point. Therefore, it is not necessary to install and manage additional measurement and communication equipment, such as a pyranometer. This reduces the expenditure on equipment. The amount of photovoltaic power generation can be estimated more accurately by calculating the load center point with the time variation of the utilization rate being taken into consideration for each type of contract or each type of industry.

INDUSTRIAL APPLICABILITY

As described above, the power-generation-amount estimation apparatus and the power-generation-amount estimation method according to the present invention are useful for a voltage control system in a power distribution system.

REFERENCE SIGNS LIST 1 power-distribution-system management apparatus, 2 communication network, 3-1 to 3-3 load, 4-1 to 4-3 photovoltaic power generation equipment, 5-1 to 5-4 voltage and power-flow measurement device, 6-1, 6-2 breaker, 7 voltage control apparatus, 8 bus-bar, 9-1, 9-2 power distribution line, 10 contract management device, 11 load/power-generation center calculator 12 load/power-generation-amount calculator 13 power-generation-efficiency calculator, 14 power-generation-amount estimation unit, 15, 105 communication unit, 16, 103 storage, 20 load center, 21 power generation center, 100 capacitor, 101 controller, 102 input unit, 104 display, 106 output unit.

The invention claimed is:

1. A power-generation-amount estimation apparatus that estimates an amount of power generation carried along a power distribution line to which a plurality of loads and at least one power generation equipment are connected, the power-generation-amount estimation apparatus comprising:
a communication unit to receive a first voltage value, which is a measured voltage at a first position on the power distribution line, a first active power, which is a measured value of an active power at the first position, a second voltage value, which is a measured voltage at a second position on the power distribution line, and a second active power, which is a measured value of an active power at the second position;
a load center calculator to store a first set of impedance values that respectively represent impedance from the first position to a respective connection position of a respective load for each of the loads, and respective contract information on each of the loads and to calculate a load center point based, in part, on a sum of the first set of impedance values weighted on a basis of the respective contract information;
a power generation center calculator to store a second set of impedance values that respectively represent resistance from the first position to a respective connection position of the respective power generation equipment for each power generation equipment, and respective power generation capacity information, which is information on a respective power generation capacity of the respective power generation equipment, and to calculate a power generation center point based, in part, on a sum of the second set of impedance values weighted on a basis of the respective power generation capacity information; and
a power generation amount calculator to store in advance a calculation formula that associates with each other the first voltage value of the power distribution line, the second voltage value of the power distribution line, the first active power of the power distribution line, the second active power of the power distribution line, an impedance at the load center point, a resistance at the power generation center point, and an amount of power generation by the power generation equipment and to calculate an amount of power generation by the power generation equipment on a basis of the calculation formula, the first voltage value, the second voltage value, the first active power, and the second active power received by the communication unit, the impedance at the load center point, and the resistance at the power generation center point.

2. The power-generation-amount estimation apparatus according to claim 1, wherein the contract information includes a contracted power.

3. The power-generation-amount estimation apparatus according to claim 1, wherein the contract information includes a type of contract.

4. The power-generation-amount estimation apparatus according to claim 3, wherein
a time characteristic of a utilization rate of each type of contract is stored, and
the load center calculator calculates a load power of each of the loads on a basis of the time characteristic and a contracted power and calculates the impedance at the load center point on a basis of the connection position and the load power of each of the loads.

5. The power-generation-amount estimation apparatus according to claim 1, wherein the contract information includes a type of industry.

6. The power-generation-amount estimation apparatus according to claim 5, wherein
a time characteristic of a utilization rate of each type of industry is stored as an industry-type time characteristic, and
the load center calculator calculates a load power of each of the loads on a basis of the industry-type time characteristic and a contracted power, and calculates the impedance at the load center point on a basis of the connection position and the load power of each of the loads.

7. The power-generation-amount estimation apparatus according to claim 1, wherein
the first position is an end point on an upstream side of the power distribution line, and
the second position is an end point on a downstream side of the power distribution line.

8. The power-generation-amount estimation apparatus according to claim 1, wherein
the first position is an end point on an upstream side of a power distribution section in the power distribution line, and
the second position is an end point on a downstream side of the power distribution section.

9. The power-generation-amount estimation apparatus according to claim 1, wherein each of the loads is a load due to each customer.

10. The power-generation-amount estimation apparatus according to claim 1, wherein each of the loads is a load due to each pole transformer.

11. The power-generation-amount estimation apparatus according to claim 1, wherein
an amount of photovoltaic power generation carried along a plurality of the power distribution lines is to be estimated,
the amount of photovoltaic power generation is estimated for each of the power distribution lines, a power generation efficiency is calculated on a basis of the estimated amount of photovoltaic power generation and a power generation capacity of a photovoltaic power generation equipment connected to each of the power distribution lines, an average power generation efficiency, which is an average value of the power generation efficiency of two or more power distribution lines, is calculated, and for the power distribution line for which the first voltage value, the first active power, the second voltage value, and the second active power are not measured among the power distribution lines, an amount of photovoltaic power generation is estimated on a basis of the average power generation efficiency and a power generation capacity of a photovoltaic power generation equipment connected to the power distribution line.

12. The power-generation-amount estimation apparatus according to claim 1, wherein the calculation formula stored by the power generation amount calculator is created on a basis of a condition that a difference between the amount of power generation by the power generation equipment and a load power on the power distribution line is equal to a difference between the second active power and the first active power.

13. The power-generation-amount estimation apparatus according to claim 1, wherein an amount of photovoltaic power generation carried along a plurality of the power distribution lines is to be estimated, and for a first power distribution line among the power distribution lines, an amount of photovoltaic power generation is estimated on a basis of an estimation result of an amount of photovoltaic power generation carried along a second power distribution line, which is at least one of the power distribution lines and is other than the first power distribution line, and a power generation capacity of a photovoltaic power generation equipment connected to the first power distribution line.

14. A power-generation-amount estimation method of estimating an amount of power generation carried along a power distribution line to which a plurality of loads and at least one power generation equipment are connected, the power-generation-amount estimation method comprising:

receiving a first voltage value, which is a measured voltage at a first position on the power distribution line, a first active power, which is a measured value of an active power at the first position, a second voltage value, which is a measured voltage at a second position on the power distribution line, and a second active power, which is a measured value of an active power at the second position;

storing a first set of impedance values, that represent an impedance from the first position to a respective connection position of a respective load for each of the loads, and respective contract information on each of the loads and calculating a load center point based, in part, on a sum of the first set of impedance values weighted on a basis of the respective contract information;

storing a second set of impedance values that respectively represent resistance from the first position to a respective connection position of the respective power generation equipment for each power generation equipment, and respective power generation capacity information, which is information on a respective power generation capacity of the respective power generation equipment, and calculating a power generation center point based, in part, on the second set of impedance values weighted on a basis of the respective power generation capacity information; and storing in advance a calculation formula that associates with each other the first voltage value of the power distribution line, the second voltage value of the power distribution line, the first active power of the power distribution line, the second active power of the power distribution line, an impedance at the load center point, a resistance at the power generation center point, and an amount of power generation by the power generation equipment and calculating an amount of power generation by the power generation equipment on a basis of the calculation formula, the first voltage value, the second voltage value, the first active power, and the second active power that are received, the impedance at the load center point, and the resistance at the power generation center point.

* * * * *